(12) United States Patent
Lee

(10) Patent No.: US 7,282,974 B2
(45) Date of Patent: Oct. 16, 2007

(54) DELAY LOCKED LOOP

(75) Inventor: Hyun-Woo Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 6 days.

(21) Appl. No.: 11/323,912

(22) Filed: Dec. 29, 2005

(65) Prior Publication Data

US 2007/0046347 A1 Mar. 1, 2007

(30) Foreign Application Priority Data

Aug. 29, 2005 (KR) ............... 10-2005-0079597

(51) Int. Cl.
*H03L 7/06* (2006.01)
(52) U.S. Cl. .............. 327/158; 327/149; 327/161
(58) Field of Classification Search ............ None
See application file for complete search history.

(56) References Cited

U.S. PATENT DOCUMENTS

| 6,101,197 | A | 8/2000 | Keeth et al. | |
|---|---|---|---|---|
| 6,710,636 | B1 | 3/2004 | Gibbs et al. | |
| 6,724,228 | B2* | 4/2004 | Kashiwazaki | 327/158 |
| 6,765,976 | B1 | 7/2004 | Oh | |
| 6,801,472 | B2* | 10/2004 | Lee | 365/233 |
| 6,803,826 | B2 | 10/2004 | Gomm et al. | |
| 6,812,799 | B2 | 11/2004 | Kirsch | |
| 6,917,229 | B2* | 7/2005 | Cho | 327/158 |
| 6,943,602 | B1* | 9/2005 | Lee | 327/158 |
| 6,982,579 | B2* | 1/2006 | Lee | 327/158 |
| 7,161,397 | B2* | 1/2007 | Lee et al. | 327/149 |
| 2003/0151433 | A1 | 8/2003 | Takai | |
| 2005/0024107 | A1* | 2/2005 | Takai et al. | 327/158 |

FOREIGN PATENT DOCUMENTS

| JP | 2003-69424 | 1/2003 |
|---|---|---|
| KR | 1020030090129 | 11/2003 |
| KR | 10-2004-0046328 | 6/2004 |
| KR | 1020040095981 | 11/2004 |

* cited by examiner

*Primary Examiner*—Cassandra Cox
(74) *Attorney, Agent, or Firm*—Blakely Sokoloff Taylor & Zafman

(57) ABSTRACT

A DLL for reducing jitter during a high frequency operation by separately controlling a coarse delay and a fine delay. The DLL includes a multiplexing unit for selectively outputting one of the rising clock and the falling clock; a first delay line for generating a first internal clock and a second internal clock; a second delay line for generating a first clock and a second clock; a delay line control unit for controlling the second delay line; a phase control unit for generating a first DLL clock and a second DLL clock by mixing the first clock and the second clock; and a phase comparing unit for comparing the first DLL clock and the second DLL clock with the rising clock to generate a lock signal for controlling an operation timing of the first delay line and the second delay line.

24 Claims, 16 Drawing Sheets

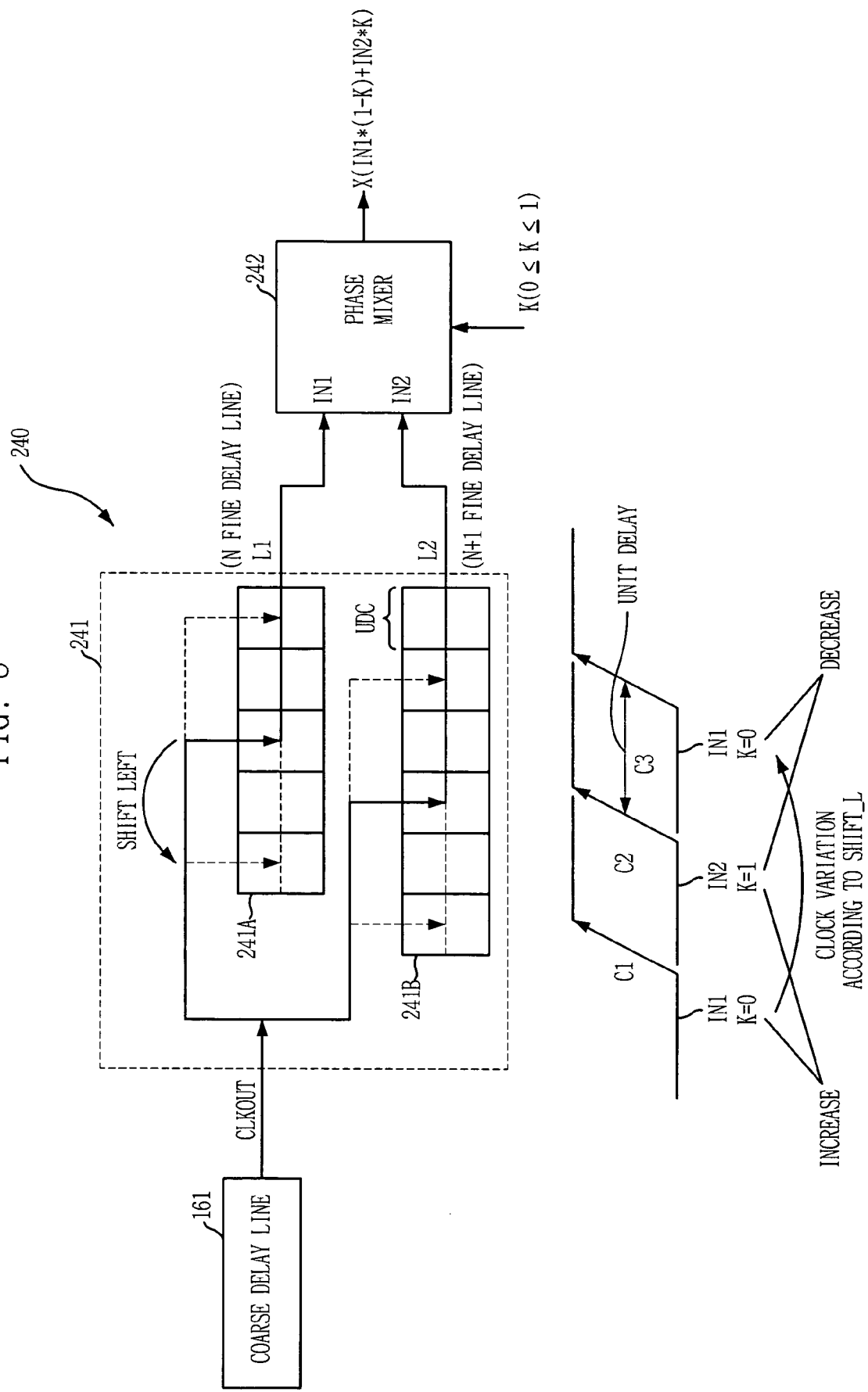

FIG. 10
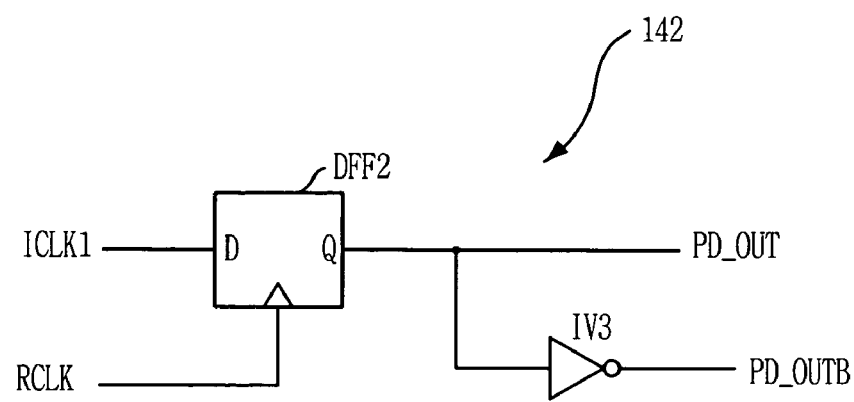
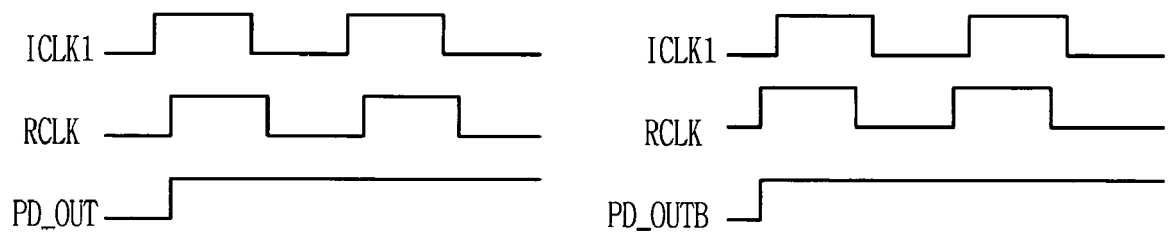

DELAY LOCKED LOOP

FIELD OF THE INVENTION

The present invention relates to a delay locked loop; and more particularly, to a delay locked loop (DLL) for reducing jitter during a high frequency operation by separately controlling a coarse delay and a fine delay.

DESCRIPTION OF RELATED ART

As a semiconductor memory device operates with high speed, a delay locked loop (hereinafter, referred to as a DLL) device is used for synchronizing an internal clock with an external clock in the semiconductor memory device. When the external clock is used in the internal circuit, a delay is inevitably generated between the external clock and an internal clock. Accordingly, the DLL device is used for compensating a clock skew, which is a difference between the internal clock and the external clock. Namely, the DLL device synchronizes the internal clock with the external clock by controlling the clock skew.

An operation speed of a dynamic random access memory (hereinafter, referred to as a DRAM) increases, the efficiency of the DLL also crucially affects the performance of the DRAM. In order to increase the efficiency of the DLL, a clock duty of the DLL has to be tightly controlled because a well-controlled clock duty decreases jitter degrading the operation speed of the DLL. Accordingly, to adequately secure a design margin, a technique for correcting the clock duty is required.

FIG. 1 is a block diagram showing a conventional DLL of a semiconductor memory device.

Referring to FIG. 1, the conventional DLL includes a first clock buffer 10, a second clock buffer 11, a coarse delay line 20, a first divider 30, a second divider 70, a phase comparator 40, a shift controller 50, a low pass filter (hereinafter, referred to as a LPF) 60, a replica 80, a first DLL driver 90 and a second DLL driver 91. Herein, the coarse delay line 20 includes a plurality of delay lines such as a first delay line 21 and a second delay line 22, and a shift resister 23.

The first clock buffer 10 receives an external clock ECLK and an inverted external clock ECLKB to generate an internal falling clock FCLK2 in synchronization with a falling edge of the external clock ECLK. The second clock buffer 11 receives the external clock ECLK and the inverted external clock ECLKB to generate an internal rising clock RCLK2 in synchronization with a rising edge of the external clock ECLK.

The first delay line 21 of the coarse delay line 20 delays the internal falling clock FCLK2 for a predetermined time to output a delayed internal falling clock to the first DLL driver 90. The second delay line 22 delays the internal rising clock RCLK2 for a predecided time to output a delayed internal rising clock to the second DLL driver 91. The shift register 23 determines delay amounts of the first delay line 21 and the second delay line 22 based on shift control signals SR and SL.

The first divider 30 generates a reference clock REF by dividing the internal rising clock RCLK2. The second divider 70 generates an output clock CLKOUT by dividing an output clock of the second delay line 22. The replica 80 generates a feedback clock FB based on the output clock CLKOUT.

The phase comparator 40 compares the reference clock REF with the feedback clock FB. The shift controller 50 generates the shift control signals SL and SR, and a lock signal DLL_LOCKZ based on an output of the phase comparator 40. The LPF 60 performs low frequency filtering for the lock signal DLL_LOCKZ and the output of the phase comparator 40, to output the filtered signals to the coarse delay line 20.

The first DLL driver 90 outputs a falling DLL clock FCLK_DLL by driving the delayed internal falling clock outputted from the first delay line 21. The second DLL driver 91 outputs a rising DLL clock RCLK_DLL by driving the delayed internal rising clock outputted from the second delay line 22.

A digital type DLL used in a double duty rate (hereinafter, referred to as a DDR) DRAM uses both the rising edge and the falling edge of the external clock ECLK. Accordingly, the DLL itself is required to have a function for correcting a duty error of the external clock ECLK. For example, even if the external clock ECLK has a high pulse width larger than a low pulse width, or otherwise, the rising and the falling DLL clocks used in the DDR DRAM are exactly corrected to have a same width, i.e., a duty rate of the rising and the falling DLL clocks is 50%.

In the conventional DLL, it is possible to adjust a delay of whole phases by using the reference clock REF and the feedback clock FB, but it is hard to exactly correct the duty cycle. Moreover, in case of a duty cycle correction (hereinafter, referred to as a DCC) operation, a performance for correcting the duty error in the DLL is deteriorated because a mixed input signal is variable according to a voltage level of an external source voltage. As a result, jitter appears in the DLL of the DRAM.

SUMMARY OF THE INVENTION

It is, therefore, an object of the present invention to provide a delay locked loop (DLL) for reducing jitter during a high frequency operation by separately controlling a coarse delay and a fine delay.

In accordance with an aspect of the present invention, there is provided a DLL for reducing jitter, including: a multiplexing unit for receiving an external clock and an inverted external clock to generate a rising clock and a falling clock having an inverse phase of the rising clock, and selectively outputting one of the rising clock and the falling clock according to a first phase comparing signal; a first delay line for generating a first internal clock by delaying an output clock of the multiplexing unit for a certain time, and generating a second internal clock by delaying the first internal clock for a determined time, in response to the first phase comparing signal and a second phase comparing signal; a delay line control unit for generating an enable signal whose activation is controlled by a phase difference between the rising clock and the falling clock when a duty cycle correction mode enters; a second delay line for generating a first clock by delaying the first internal clock for a predetermined time, and generating a second clock by delaying the second internal clock for a preset time, under the control of the enable signal; a phase control unit for outputting a plurality of mix control signals by comparing a phase of the first clock with a phase of the second clock, and generating a first DLL clock and a second DLL clock by mixing the phases of the first clock and the second clock in response to the plurality of the mix control signals; and a phase comparing unit for generating the first phase comparing signal and the second phase comparing signal by comparing a phase of the first DLL clock and the second DLL clock with a phase of the rising clock, and generating a lock signal for controlling an operation timing of the first delay line and the second delay line.

BRIEF DESCRIPTION OF THE DRAWINGS

The above and other objects and features of the present invention will become apparent from the following description of the preferred embodiments given in conjunction with the accompanying drawings, in which:

FIG. 8 is an operational block diagram illustrating an operation of the first fine delay line shown in FIG. 7;

FIG. 10 is a detailed circuit diagram showing a first phase comparator of a first phase comparator & lock detector as shown in FIG. 2;

DETAILED DESCRIPTION OF THE INVENTION

Other objects and aspects of the invention will become apparent from the following description of the embodiments with reference to the accompanying drawings, which is set forth hereinafter.

Figure 1:
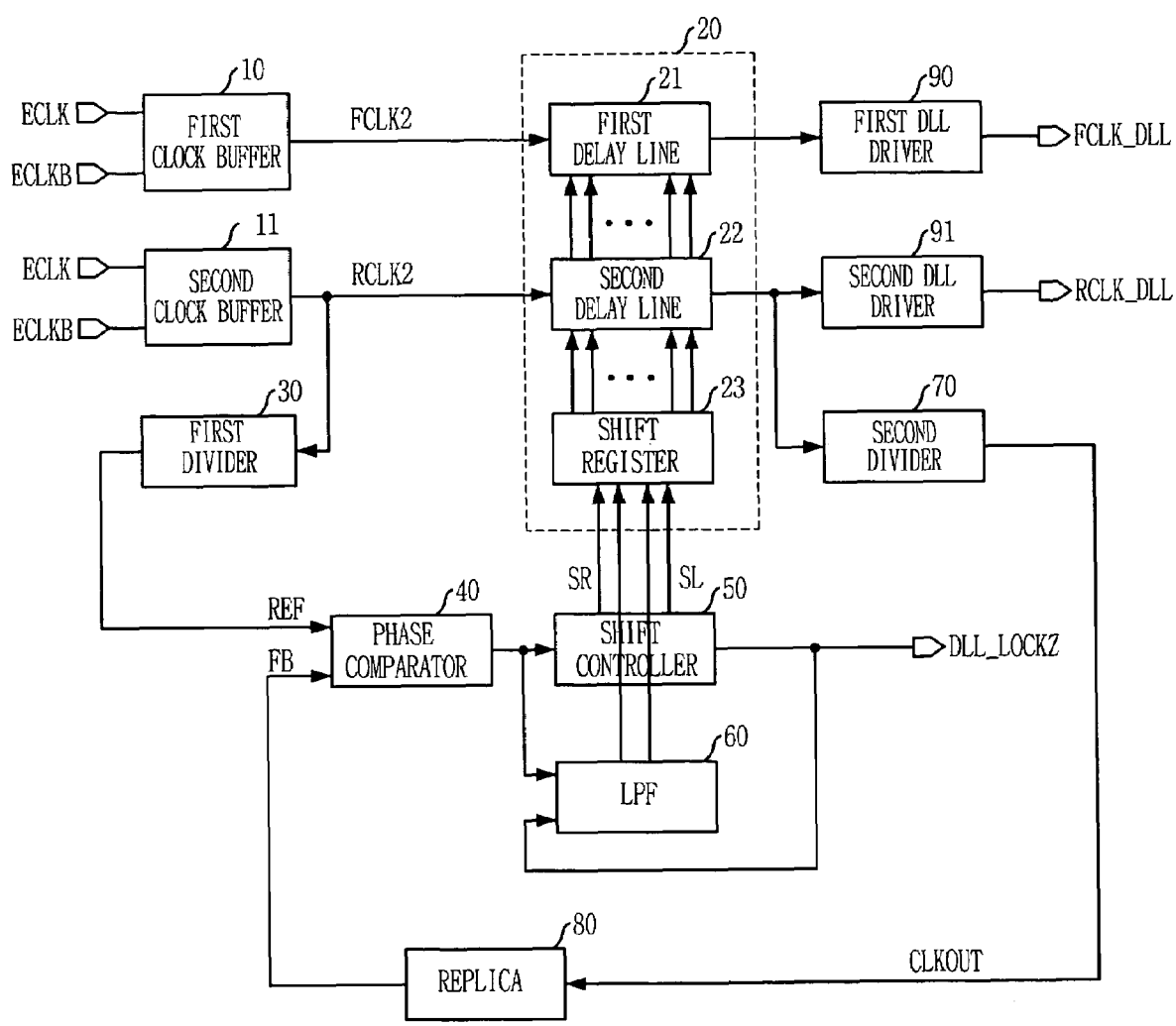
FIG. 1 is a block diagram showing a conventional delay locked loop (DLL) of a semiconductor memory device.
Figure 2:
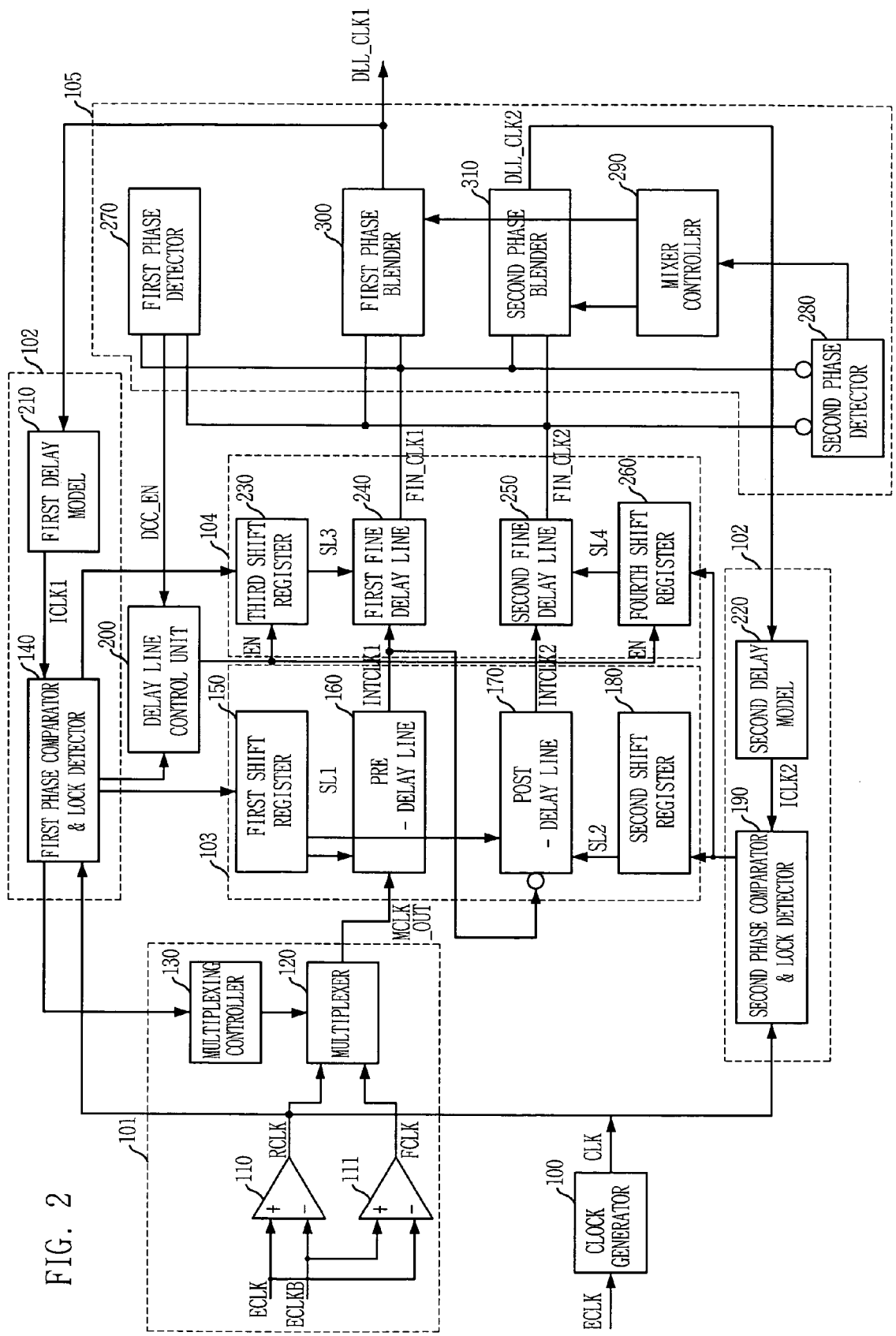
FIG. 2 is a block diagram showing a delay locked loop (DLL) of a semiconductor memory device in accordance with an embodiment of the present invention.

FIG. 2 is a block diagram showing a delay locked loop (DLL) of a semiconductor memory device in accordance with an embodiment of the present invention.

As shown, the DLL in accordance with an embodiment of the present invention includes a clock generating unit 100, a multiplexing unit 101, a phase comparing unit 102, a first delay line 103, a second delay line 104, a phase control unit 105, and a delay line control unit 200.

Herein, the multiplexing unit 101 includes a first clock buffer 110, a second clock buffer 111, a multiplexer 120 and a multiplexing controller 130. The phase comparing unit 102 includes a first phase comparator & lock detector 140, a second phase comparator & lock detector 190, a first delay model 210 and a second delay model 220. The first delay line 103 includes a first shift register 150, a second shift register 180, a pre-delay line 160 and a post-delay line 170. The second delay line 103 includes a third shift register 230, a fourth shift register 260, a first fine delay line 240 and a second fine delay line 250. The phase control unit 105 includes a first phase detector 270, a second phase detector 280, a phase mixer control unit 290, a first phase blender 300 and a second phase blender 310.

The clock generating unit 100 outputs sequentially a plurality of intermediate clocks CLK based on an external clock ECLK. According to the intermediate clock CLK, it is possible to set a delay amount of each of the multiplexing controller 130, the first phase comparator & lock detector 140, the second phase comparator & lock detector 190, the first to the fourth shift register 150, 180, 230 and 260, the delay line control unit 200 and the phase mixer control unit 290.

The first clock buffer 110 receives the external clock ECLK via a non-inverting input node (+) and an inverted external clock ECLKB via an inverting input node (−), so as to output a rising clock RCLK having the same phase with the external clock ECLK to the multiplexer 120. The second clock buffer 111 receives the inverted external clock ECLKB via a non-inverting input node (+) and the external clock ECLK via an inverting input node (−), so as to output a falling clock FCLK having the same phase with the inverted external clock ECLKB to the multiplexer 120.

The multiplexing controller 130 outputs a select signal for controlling the multiplexer 120, based on a first phase comparing signal PD_OUT outputted from the first phase comparator & lock detector 140. The multiplexer 120 selects one of the rising clock RCLK and the falling clock FCLK based on the select signal, so as to output the selected clock as a multiplexing output clock MCLK_OUT. Accordingly, one of the rising clock RCLK and the falling clock FCLK inputted to the pre-delay line 160 is delayed by a (0.5× tCLK) at maximum according to a first shift control signal SL1 outputted from the first shift register 150.

The first phase comparator & lock detector 140 compares a phase of a first internal delay clock ICLK1 with the phase of the rising clock rising clock RCLK, so as to output a left shift signal SHIFT_L and a right shift signal SHIFT_R for adjusting a delay amount of corresponding clocks to the multiplexing controller 130, the first and the third shift register 150 and 230, and the delay line control unit 200. Also, the first phase comparator & lock detector 140 generates the first phase comparing signal PD_OUT by comparing the rising clock RCLK and the first internal delay clock ICLK1. In this time, the first phase comparator & lock detector 140 generates a first lock signal LOCK_STATE to output the first and the third shift register 150 and 230, based on the first phase comparing signal PD_OUT in synchronization with the intermediate clock CLK.

The first shift register 150 receives the left shift signal SHIFT_L, the right shift signal SHIFT_R and the first lock signal LOCK_STATE outputted from the first phase comparator & lock detector 140 to output the first shift control signal SL1 for controlling a delay amount of corresponding clocks to the pre-delay line 160 and the post-delay line 170.

The pre-delay line 160 outputs a first internal clock INTCLK1 based on the first shift control signal SL1 outputted from the first shift register 150 and the multiplexing output clock MCLK_OUT outputted from the multiplexer 120.

The post-delay line 170 receives the first internal clock INTCLK1 to output a second internal clock INTCLK2 based on the first shift control signal SL1 outputted from the first shift register 150 and a second shift control signal SL2 outputted from the second shift register 180.

The second shift register 180 receives a left shift signal SHIFT_L, a right shift signal SHIFT_R and a second lock signal outputted from the second phase comparator & lock detector 190 to output the second shift control signal SL2 for controlling a delay amount of corresponding clocks to the post-delay line 170.

The second phase comparator & lock detector 190 compares a phase of a second internal delay clock ICLK2 with the phase of the rising clock RCLK, to output the left shift signal SHIFT_L and the right shift signal SHIFT_R for adjusting a delay amount of corresponding clocks to the second shift register 180 and the fourth shift register 260. At this time, the second phase comparator & lock detector 190 generates the second lock signal to output the second and the fourth shift register 180 and 260, based on the second phase comparing signal in synchronization with the intermediate clock CLK.

The delay line control unit 200 outputs an enable signal EN to the third shift register 230 and the fourth shift register 260. The enable signal EN activates one of the first fine delay line 240 and the second fine delay line 250 according to outputs of the first phase comparator & lock detector 140 and the first phase detector 270.

The first delay model 210 receives a first DLL clock DLL_CLK1 whose duty cycle is adjusted to output the first internal delay clock ICLK1 to the first phase comparator & lock detector 140 by compensating a time difference between the intermediate clock CLK generated from the external clock ECLK and the first internal clock INTCLK1.

The second delay model 220 receives a second DLL clock DLL_CLK2 whose duty cycle is adjusted to output the second internal delay clock ICLK2 to the second phase comparator & lock detector 190 by compensating a time difference between the intermediate clock CLK and the second internal clock INTCLK2.

The third shift register 230 receives the left shift signal SHIFT_L, the right shift signal SHIFT_R and the first lock signal LOCK_STATE outputted from the first phase comparator & lock detector 140, to output a third shift control signal SL3 to the first fine delay line 240.

The first fine delay line 240 elaborately adjusts a delay amount of the first internal clock INTCLK1 based on the third shift control signal SL3, to output the adjusted clock as a first clock FIN_CLK1 to the first phase blender 300.

The fourth shift register 260 receives the left shift signal SHIFT_L, the right shift signal SHIFT_R and the second lock signal outputted from the second phase comparator & lock detector 190 to output a fourth shift control signal SL4 to the second fine delay 250.

The second fine delay 250 elaborately adjusts a delay amount of the second internal clock INTCLK2 based on the fourth shift control signal SL4, to output the adjusted clock as a second clock FIN_CLK2 to the second phase blender 310.

The first phase detector 270 compares the first clock FIN_CLK1 with the second clock FIN_CLK2 to output the compared result as a correct enable signal DCC_EN to the delay line control unit 200.

The second phase detector 280 compares an inverted first clock outputted from the first fine delay line 240 and an inverted second clock outputted from the second fine delay 250 to output the compared result as a phase detect signal to the phase mixer control unit 290.

The phase mixer control unit 290 determines a plurality of first mix control signals and second mix control signals based on the phase detect signal outputted from the second phase detector 280, to output the determined signals to the first phase blender 300 and the second phase blender 310.

The first phase blender 300 generates the first DLL clock DLL_CLK1 by mixing the first clock FIN_CLK1 outputted from the first fine delay line 240 and the second clock FIN_CLK2 outputted from the second fine delay 250, based on the first mix control signals outputted from the phase mixer control unit 290. As a result, the duty cycle of the first DLL clock DLL_CLK1 can be adjusted.

Likewise, the second phase blender 310 generates the second DLL clock DLL_CLK2 by mixing the first clock FIN_CLK1 and the second clock FIN_CLK2 based on the second mix control signals outputted from the phase mixer control unit 290. As a result, the second DLL clock DLL_CLK2 whose duty cycle is adjusted is outputted to the second delay model 220.

Figure 3:
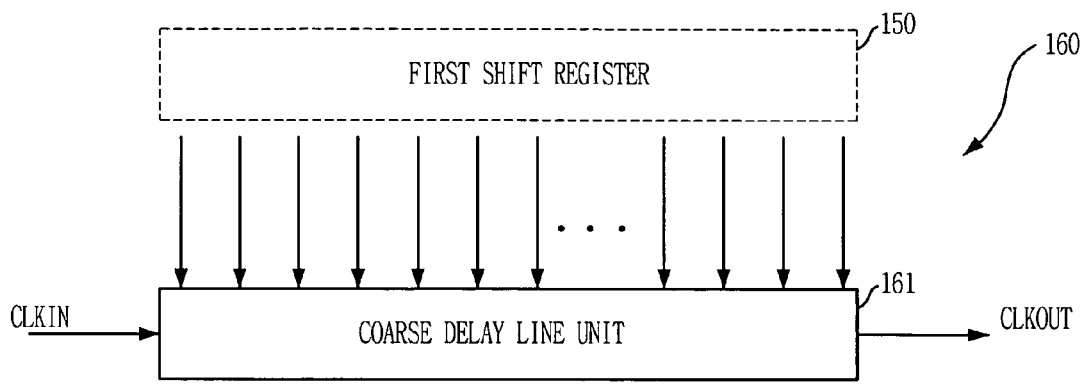
FIG. 3 is a detailed block diagram describing a pre-delay line shown in FIG. 2.

FIG. 3 is a detailed block diagram describing the pre-delay line 160 shown in FIG. 2.

As shown, the pre-delay line 160 includes a coarse delay line unit 161 for adjusting a coarse delay of an input clock CLKIN, to generate the adjusted value as an output clock CLKOUT, based on the first shift control signal SL1 outputted from the first shift register 150. Herein, the input clock CLKIN denotes the multiplexing output clock MCLK_OUT and the output clock CLKOUT denotes the first internal clock INTCLK1.

The coarse delay line unit 161 has a single delay line structure because the coarse delay line unit 161 does not perform a boundary switching operation.

The post-delay line 170 can be implemented with the same structure as that of the pre-delay line 160 except that the post-delay line 170 receives the second shift control signal SL2 outputted from the second shift register 180. Herein, in case of the post-delay line 170, the input clock CLKIN denotes the first internal clock INTCLK1 and the output clock CLKOUT denotes the second internal clock INTCLK2.

Figure 4:
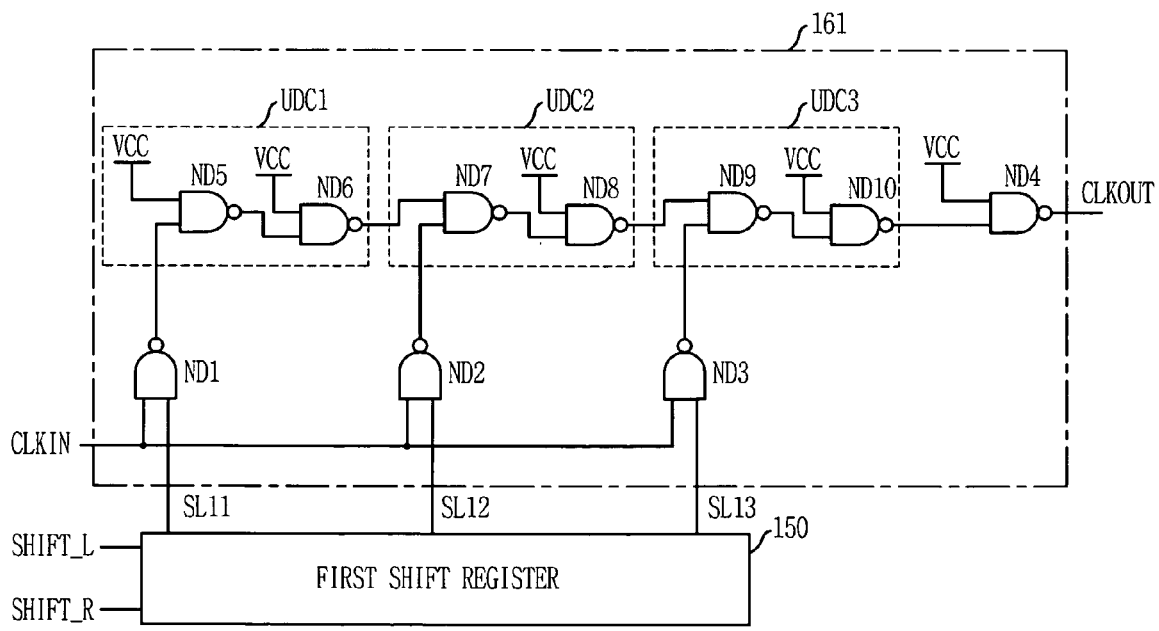
FIG. 4 is a detailed circuit diagram depicting a coarse delay line unit shown in FIG. 3.
Figure 5:
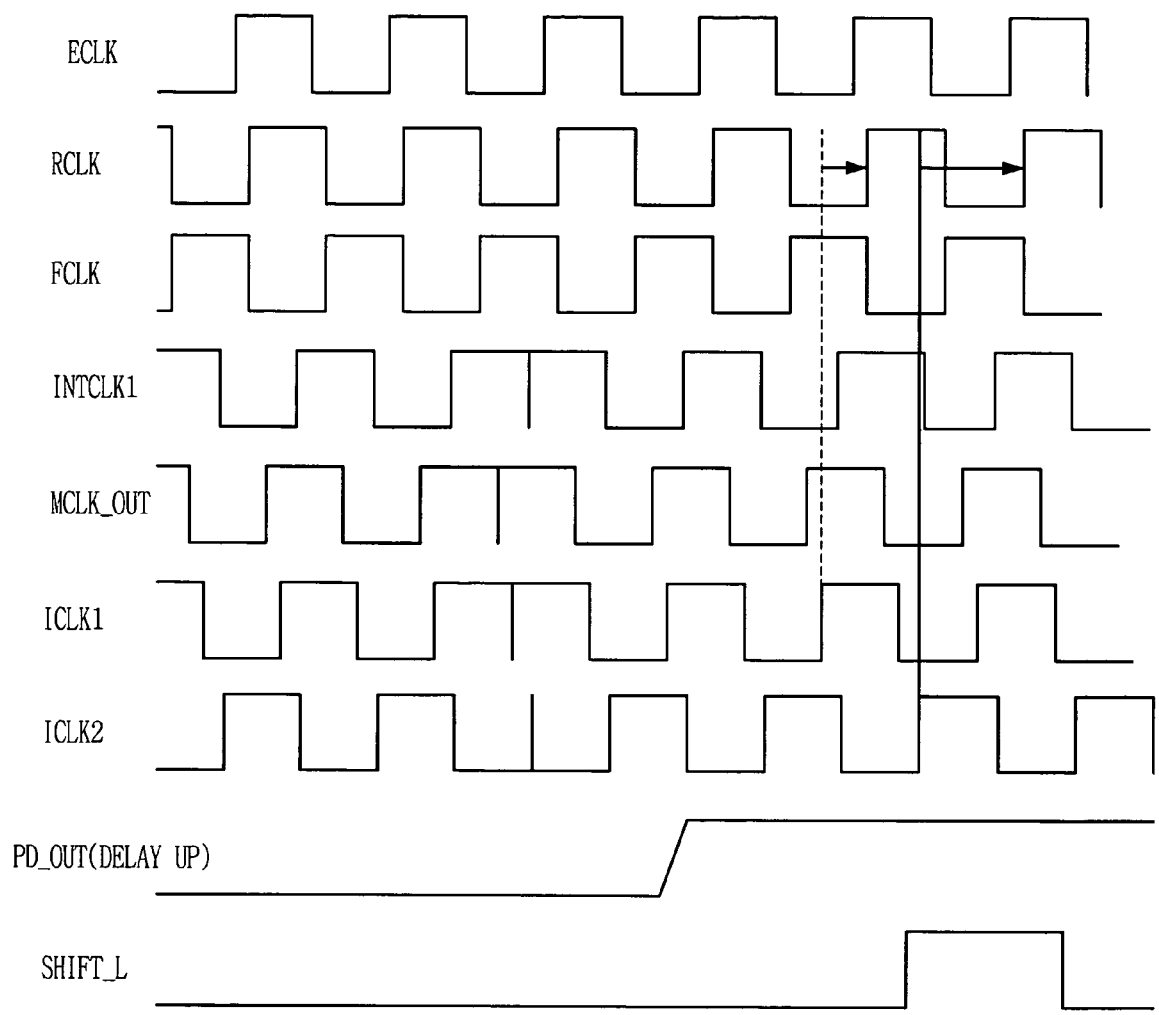
FIGS. 5 and 6 are timing diagrams illustrating an operation of the coarse delay line unit shown in FIG. 4.
Figure 6:
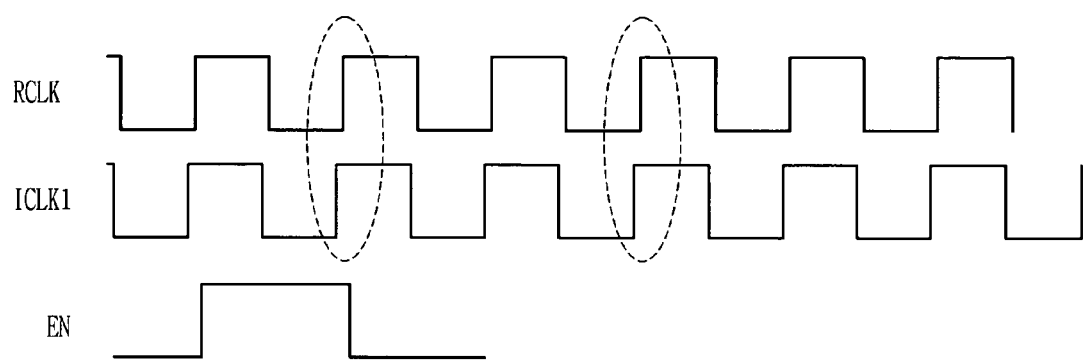

FIG. 4 is a detailed circuit diagram depicting the coarse delay line unit 161 shown in FIG. 3, and FIGS. 5 and 6 are timing diagrams illustrating an operation of the coarse delay line unit 161 shown in FIG. 4.

Referring to FIG. 4, the coarse delay line unit 161 includes a four NAND gates ND1, ND2, ND3, and ND4, and a three unit delay cells UDC1 to UDC3 connected in series.

The first NAND gate ND1 performs a NAND operation of the input clock CLKIN and one of the first shift control signal SL1, i.e., S11. The second NAND gate ND2 performs a NAND operation of the input clock CLKIN and one of the first shift control signals SL1, i.e., S12. The third NAND gate ND3 performs a NAND operation of the input clock CLKIN and one of the first shift control signals SL1, i.e., S13.

The first unit delay cell UDC1 includes a fifth NAND gate ND5 and a sixth NAND gate ND6. The fifth NAND gate ND5 performs a NAND operation of a source voltage VCC and an output of the first NAND gate ND1. The sixth NAND gate ND6 performs a NAND operation of the source voltage VCC and an output of the fifth NAND gate ND5.

The second unit delay cell UDC2 includes a seventh NAND gate ND7 and an eighth NAND gate ND8. The seventh NAND gate ND7 performs a NAND operation of an output of the first unit delay cell UDC1 and an output of the second NAND gate ND2. The eighth NAND gate ND8 performs a NAND operation of the source voltage VCC and an output of the seventh NAND gate ND7.

The third unit delay cell UDC3 includes a ninth NAND gate ND9 and a tenth NAND gate ND10. The ninth NAND gate ND9 performs a NAND operation of an output of the second unit delay cell UDC2 and an output of the third NAND gate ND3. The tenth NAND gate ND10 performs a NAND operation of the source voltage VCC and an output of the ninth NAND gate ND9.

Finally, the fourth NAND gate ND4 performs a NAND operation of the source voltage VCC and an output of the third unit delay cell UDC3, to output the output clock CLKOUT.

As described above, the coarse delay line unit 161 can generate the output clock CLKOUT having a delay determined by the number of the activated unit delay cells. In other words, in the case that the left shift signal SHIFT_L outputted from the first phase comparator & lock detector 140 is inputted to the first shift register 150, the coarse delay line unit 161 adjusts the coarse delay based on the first shift control signal S1, i.e., SL11 to SL13, and the multiplexing output clock MCLK_OUT. As a result, as shown in FIG. 5, the first internal clock INTCLK1 and the second internal clock INTCLK2 can be generated.

Also, as shown in FIG. 6, in case that the enable signal EN outputted from the delay line control unit 200 is activated, the left shift signal SHIFT_L and the right shift signal SHIFT_R for controlling a fine loop outputted from the first phase comparator & lock detector 140 and the second phase comparator & lock detector 190 are inputted to third shift register 230 and the fourth shift register 260. As a result, after adjusting the coarse delay, it is possible to adjust a fine delay by controlling the first fine delay line 240 and the second fine delay 250.

Figure 7:
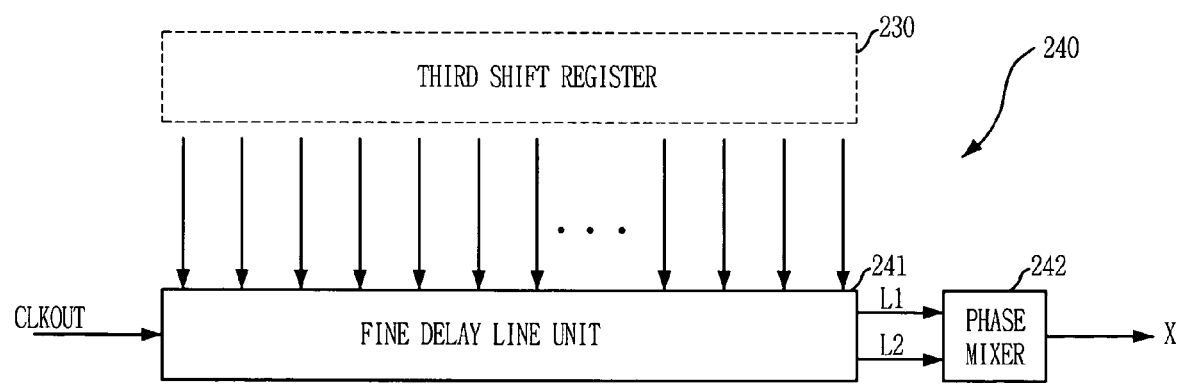
FIG. 7 is a detailed block diagram depicting a first fine delay line shown in FIG. 2.

FIG. 7 is a detailed block diagram depicting the first fine delay line 240 shown in FIG. 2.

As shown, the first fine delay line 240 includes a fine delay line unit 241 and a phase mixer 242.

The fine delay line unit 241 adjusts the fine delay of the output clock CLKOUT outputted from the coarse delay line unit 161 to generate the adjusted value as a first fine signal L1 and a second fine signal L2, based on the third shift control signals SL3 outputted from the third shift register 230.

The phase mixer 242 combines the first fine signal L1 inputted to a first node IN1 and the second fine signal L2 inputted to a second node IN2, to output the combined signal as a fine delay signal X.

Herein, in case of the first fine delay line 240, the output clock CLKOUT denotes first internal clock INTCLK1, and the fine delay signal X denotes the first clock FIN_CLK1.

The fine delay line unit 241 has a dual delay line structure because the fine delay line unit 241 performs a boundary switching operation.

The second fine delay unit 250 can be implemented with the same structure as that of the first fine delay unit 240 except that the second fine delay unit 250 receives the fourth shift control signal SL4 outputted from the fourth shift register 260. Herein, in case of the second fine delay 250, the output clock CLKOUT denotes the second internal clock INTCLK2, and the fine delay signal X denotes the second clock FIN_CLK2.

FIG. 8 is an operational block diagram illustrating an operation of the first fine delay line 240 shown in FIG. 7.

As shown, the output clock CLKOUT is inputted to an N fine delay line 241a having a three-unit delay line, and the output clock CLKOUT is also inputted to an (N+1) fine delay line 241b having a four-unit delay line.

For example, in case that a weight of the phase mixer 242 is zero, the three-delayed output clock CLKOUT through the N fine delay line 241a is outputted as the fine delay signal X.

In this time, the first phase detector 270 and the second phase detector 280 detect a phase of the fine delay signal X.

If a phase of the output clock CLKOUT is in advance of a phase of the external clock ECLK, the weight K is gradually increased. Hence, the phase mixer 242 outputs the fine delay signal X which is close to the second fine signal L2 among the first fine signal L1 and the second fine signal L2. After then, when the weight K becomes 1, the phase mixer 242 outputs the fine delay signal X as the second fine signal L2 inputted to the second input node IN2.

In this time, even if the phase of the output clock CLKOUT is still in advance of the phase of the external clock ECLK, the N fine delay line 241a performs a shift left operation regardless of the second fine signal L2 inputted to the second input node IN2.

That is, in this time, even if the N fine delay line 241a uses a five-unit delay line, not the three-unit delay line, the phase mixer 242 outputs the fine delay signal X as the second fine signal L2 outputted from the (N+1) fine delay line 241b because the weight K is 1. Therefore, a variation of the delay amount related with the N fine delay line 241a is not affected to outputs of the first phase blender 300 and the second phase blender 310. Accordingly, it is possible to perform a seamless boundary switching operation.

After the N fine delay line 241a performs a shift left operation, to increase the phase of the output clock output clock CLKOUT, the weight K may be decreased. At this time, the fine delay signal X is close to the first fine signal L1 inputted to the first input node IN1. As shown in FIG. 8, the fine delay signal X is transitioned from a second clock C2 to a third clock C3.

Figure 9A:
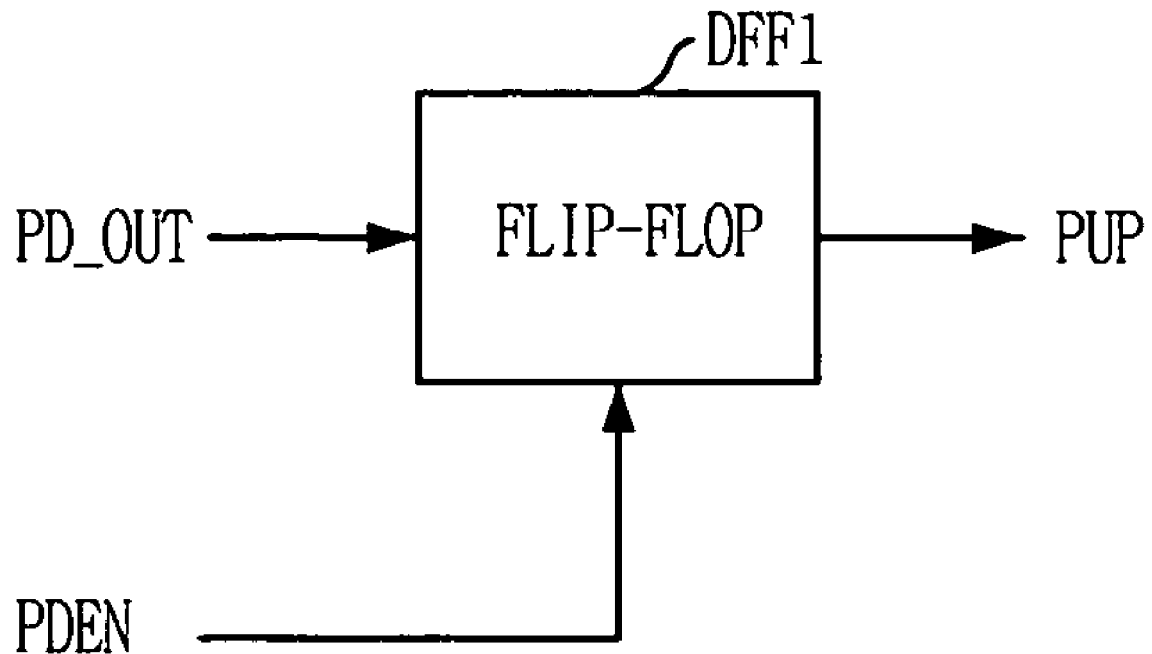
FIGS. 9A to 9C are detailed circuit diagrams showing a delay line control unit as shown in FIG. 2.
Figure 9B:
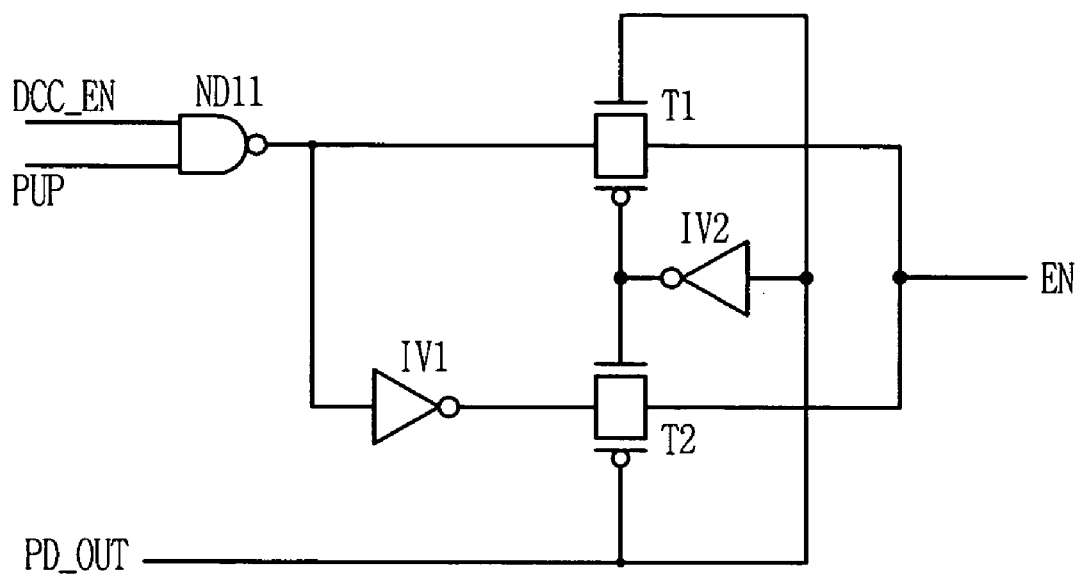
Figure 9C:
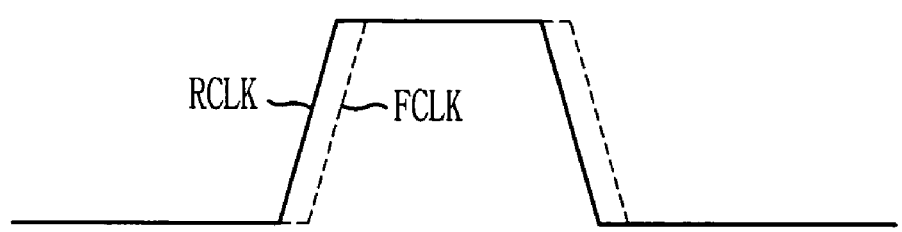

FIGS. 9A to 9C are detailed circuit diagrams showing the delay line control unit 200 as shown in FIG. 2.

As shown, the delay line control unit 200 includes a first flip-flop DFF1, a eleventh NAND gate ND11, a first transfer gate T1, a second transfer gate T2, a first inverter IV1 and a second inverter IV2.

Referring to FIG. 9A, the first flip-flop DFF1 synchronizes the first phase comparing signal PD_OUT with a clock enable signal PDEN to output the synchronized signal as a phase control signal PUP. Herein, the clock enable signal PDEN denotes the intermediate clock CLK. The phase control signal PUP is a latched signal of the first phase comparing signal PD_OUT so that the phase control signal PUP can be used in case of need. Namely, the first phase comparing signal PD_OUT in the past as well as in the present is used for the phase control signal PUP.

Referring to FIG. 9B, the eleventh NAND gate ND11 performs a NAND operation of the phase control signal PUP and the correct enable signal DCC_EN. The first transfer gate T1 outputs an output of the eleventh NAND gate ND11 as the enable signal EN according to the first phase comparing signal PD_OUT. The first inverter IV1 inverts an output of the first transfer gate T1 and the second inverter IV2 inverts the first phase comparing signal PD_OUT. The second transfer gate T2 outputs an output of the first inverter IV1 as the enable signal EN according to an output of the second inverter IV2.

FIG. 10 is a detailed circuit diagram showing a first phase comparator 142 of the first phase comparator & lock detector 140 as shown in FIG. 2.

As shown, the first phase comparator 142 includes a second flip-flop DFF2 and a third inverter IV3.

The second flip-flop DFF2 outputs the first phase comparing signal PD_OUT by latching the first internal delay clock ICLK1 in synchronization with the rising clock RCLK. The third inverter IV3 inverts the first phase comparing signal PD_OUT to output an inverted first phase comparing signal PD_OUTB.

In other words, when the phase of the rising clock RCLK is the same phase as the first internal delay clock ICLK1, the first phase comparing signal PD_OUT is activated. On the contrary, when the phase of the rising clock RCLK is advanced to the phase of the first internal delay clock ICLK1, the inverted first phase comparing signal PD_OUTB is activated.

The second phase comparator of the second phase comparator & lock detector 190 can be implemented with the same structure as that of the first phase comparator 142.

Figure 11:
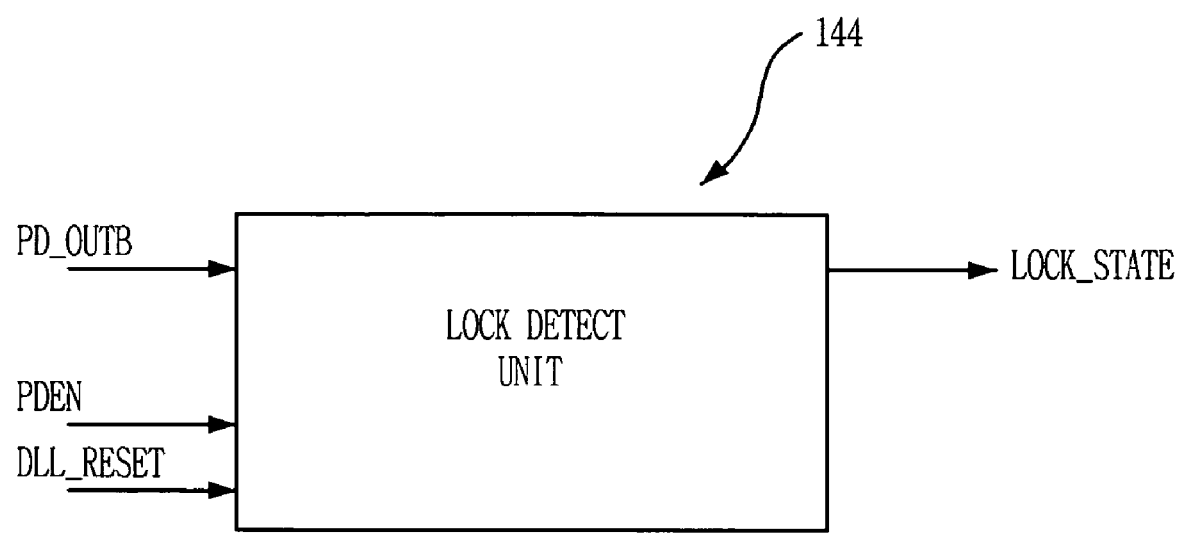
FIG. 11 is a block diagram showing a first lock detector of a first phase comparator & lock detector as shown in FIG. 2.

FIG. 11 is a block diagram showing a first lock detector 144 of the first comparator & lock detector 140 as shown in FIG. 2.

As shown, the first lock detector 144 samples the inverted first phase comparing signal PD_OUTB outputted from the first phase comparator 142 to generate the lock signal LOCK_STATE, based on the clock enable signal PDEN and a reset signal DLL_RESET.

The second lock detector of the second phase comparator & lock detector 190 can be implemented with the same structure as that of the first lock detector 144.

Figure 12:
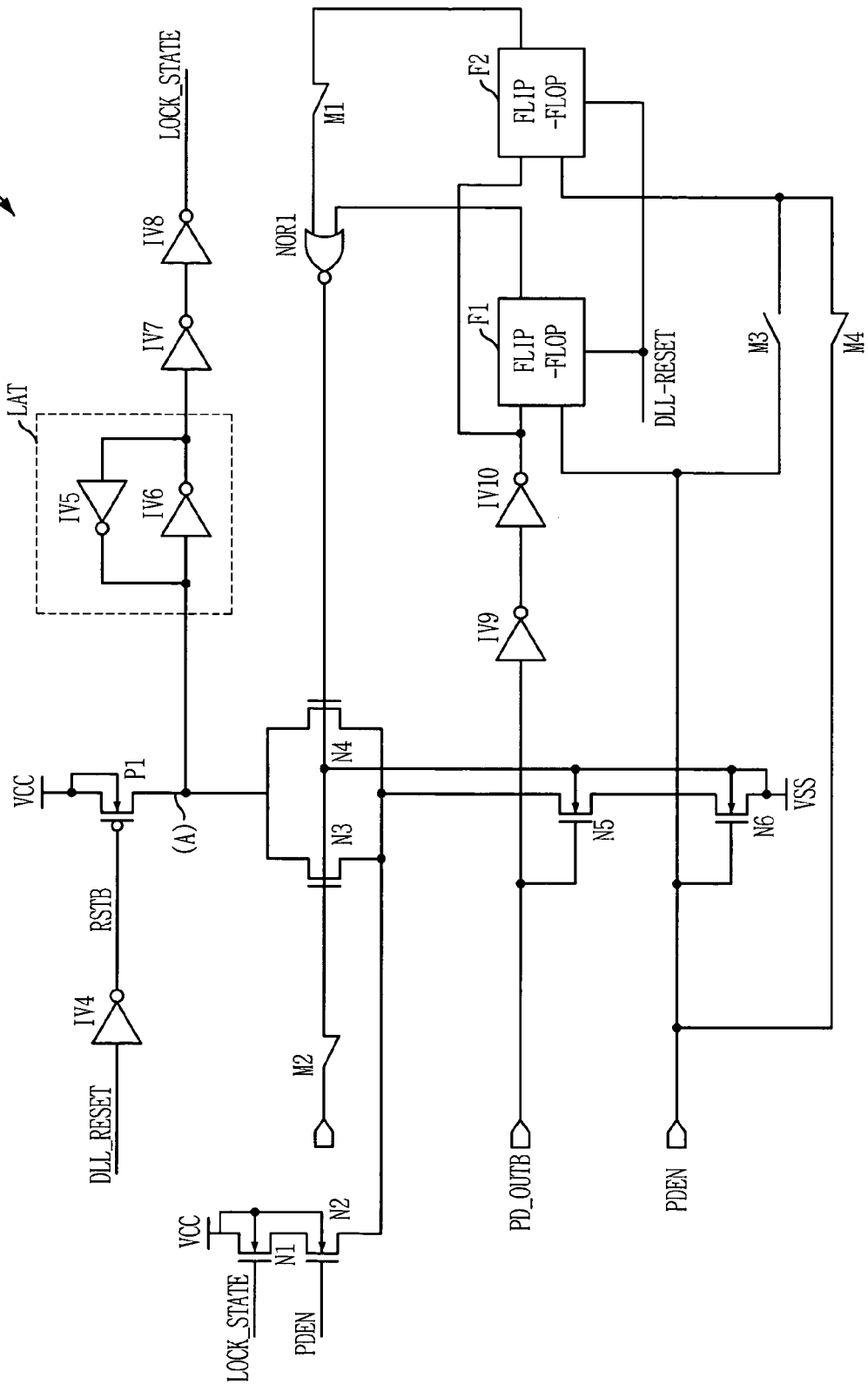
FIG. 12 is a detailed circuit diagram describing the first lock detector as shown in FIG. 11.

FIG. 12 is a detailed circuit diagram describing the first lock detector 144 as shown in FIG. 11.

As shown, the first lock detector 144 includes a plurality of inverters IV4 to IV10, a first PMOS transistor P1, a plurality of NMOS transistors N1 to N6, a first NOR gate NOR1, a plurality of metal options M1 to M4, and a first and a second flip-flop FF1 and FF2.

The fourth inverter IV4 inverts the reset signal DLL_RESET to output an inverted reset signal RSTB. The first PMOS transistor P1 precharges a node A as the source voltage VCC based on the inverted reset signal RSTB. A latch LAT composed of the fifth inverter IV5 and the sixth inverter IV6 latches and outputs a signal at node A. The seventh inverter IV7 and the eighth inverter IV8 delay an output of the latch LAT without inverting, to output the first lock signal LOCK_STATE.

The first NMOS transistor N1 and the second NMOS transistor N2 selectively supply the source voltage VCC to the third to the sixth NMOS transistors N3 to N6, based on the first lock signal LOCK_STATE and the clock enable signal PDEN. The third NMOS transistor N3 and the fourth NMOS transistor N4 transfer the signal of the node A to the fifth NMOS transistor N5, based on the first metal option M1 and the first NOR gate NOR1.

The fifth NMOS transistor N5 performs a switching operation according to the inverted first phase comparing signal PD_OUTB. The sixth NMOS transistor N6 performs a switching operation according to the clock enable signal PDEN.

Meanwhile, the clock generating unit 100 generates periodic clocks CLK1 to CLK5. If a period is 20, 20 clocks are sequentially generated with a terms of one clock. At this time, when the clock enable signal PDEN is CLK3, the clock enable signal PDEN can be generated at 3, 23, 43 and so on. Likewise, when the clock enable signal PDEN is CLK7, the clock enable signal PDEN can be generated at 7, 27, 47 and so on.

Accordingly, a second clock generated in the clock generator 100 is applied to the first lock detector 144 as the clock enable signal PDEN. The first lock detector 144 samples the inverted first phase comparing signal PD_OUTB outputted from the first phase comparator 142 using the clock enable signal PDEN. In this time, if a first sampling value is in a logic level 'LOW' and a second sampling value is in a logic level 'HIGH', the first lock signal LOCK_STATE can be generated by detecting the rising edge of the rising clock RCLK.

Before the first lock signal LOCK_STATE is inactivated, the DCC operation is performed via the pre-delay line 160 and the post-delay line 170. Then, when the first lock signal LOCK_STATE is activated, the DCC operation is performed via the first fine delay line 240 and the second fine delay 250.

Figure 13:
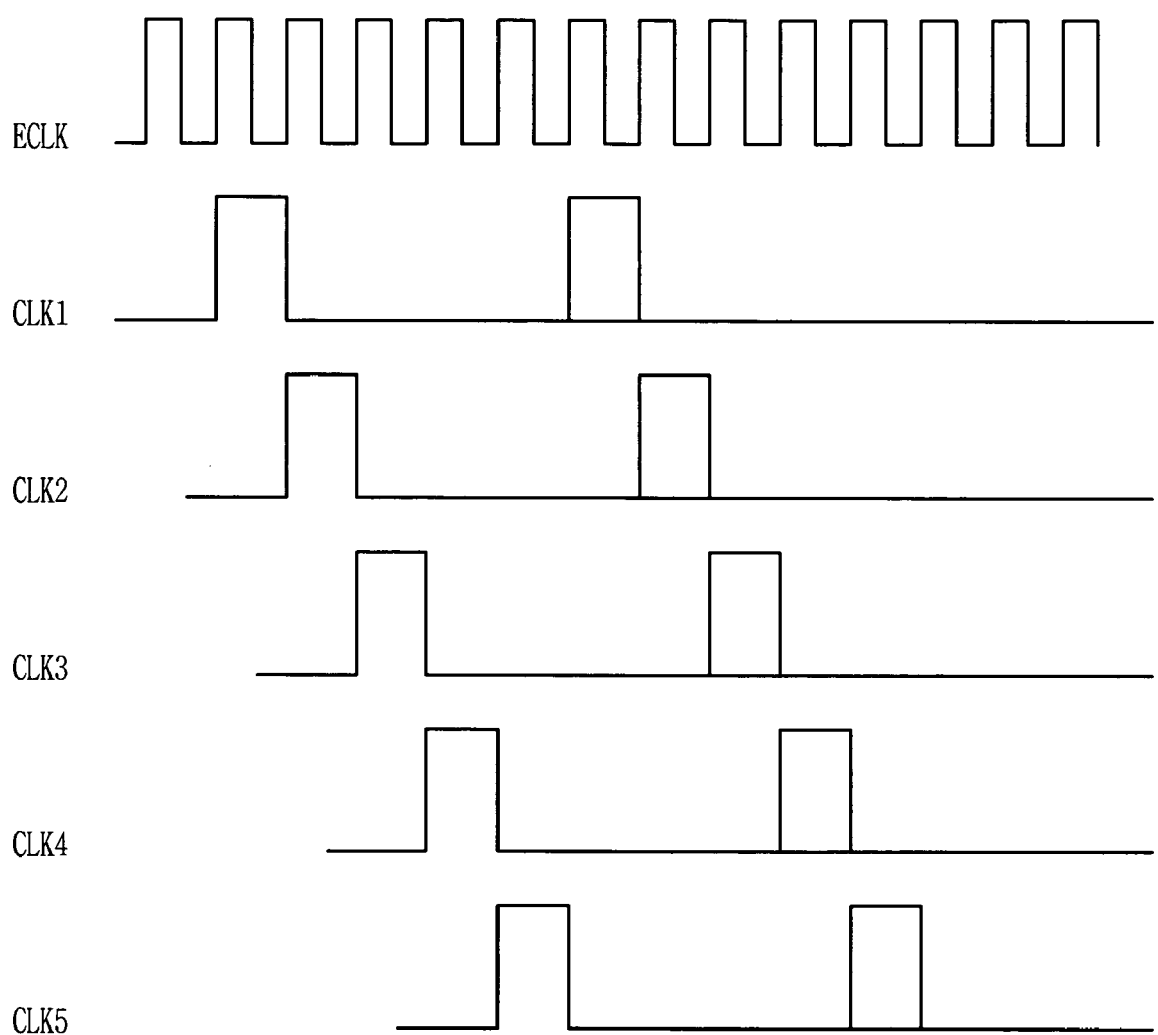
FIG. 13 is a clock waveform diagram illustrating an operation of a clock generating unit shown in FIG. 2.

FIG. 13 is a clock waveform diagram illustrating an operation of the clock generating unit 100 shown in FIG. 2.

As shown, the clock generator 100 generates a plurality of the periodic clocks CLK1 to CLK5 having a predetermined period. The periodic clocks CLK1 to CLK5 are sequentially activated in synchronization with the external clock ECLK.

FIGS. 14A to 14D are a detailed circuit diagram describing the first phase blender 300 as shown in FIG. 2.

Figure 14A:
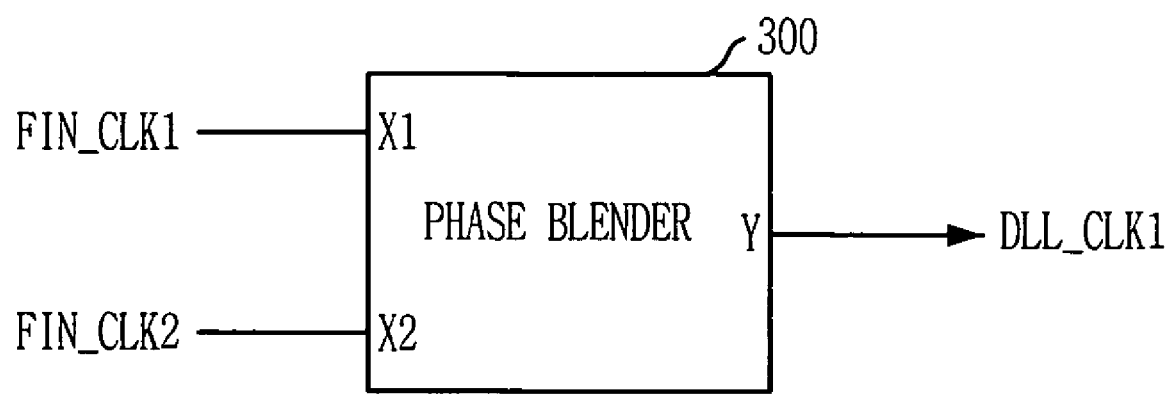
FIGS. 14A to 14D are a detailed circuit diagram describing a first phase blender as shown in FIG. 2.

In detail, FIG. 14A is a symbol diagram showing the first phase blender 300.

As shown, the first phase blender 300 mixes the first clock FIN_CLK1 inputted via a first input node X1 and the second clock FIN_CLK2 inputted via a second input node X2 to output the mixed signal as the first DLL clock DLL_CLK1 via an output node Y.

The second phase blender 310 can be implemented with the same structure as that of the first phase blender 300.

Figure 14B:
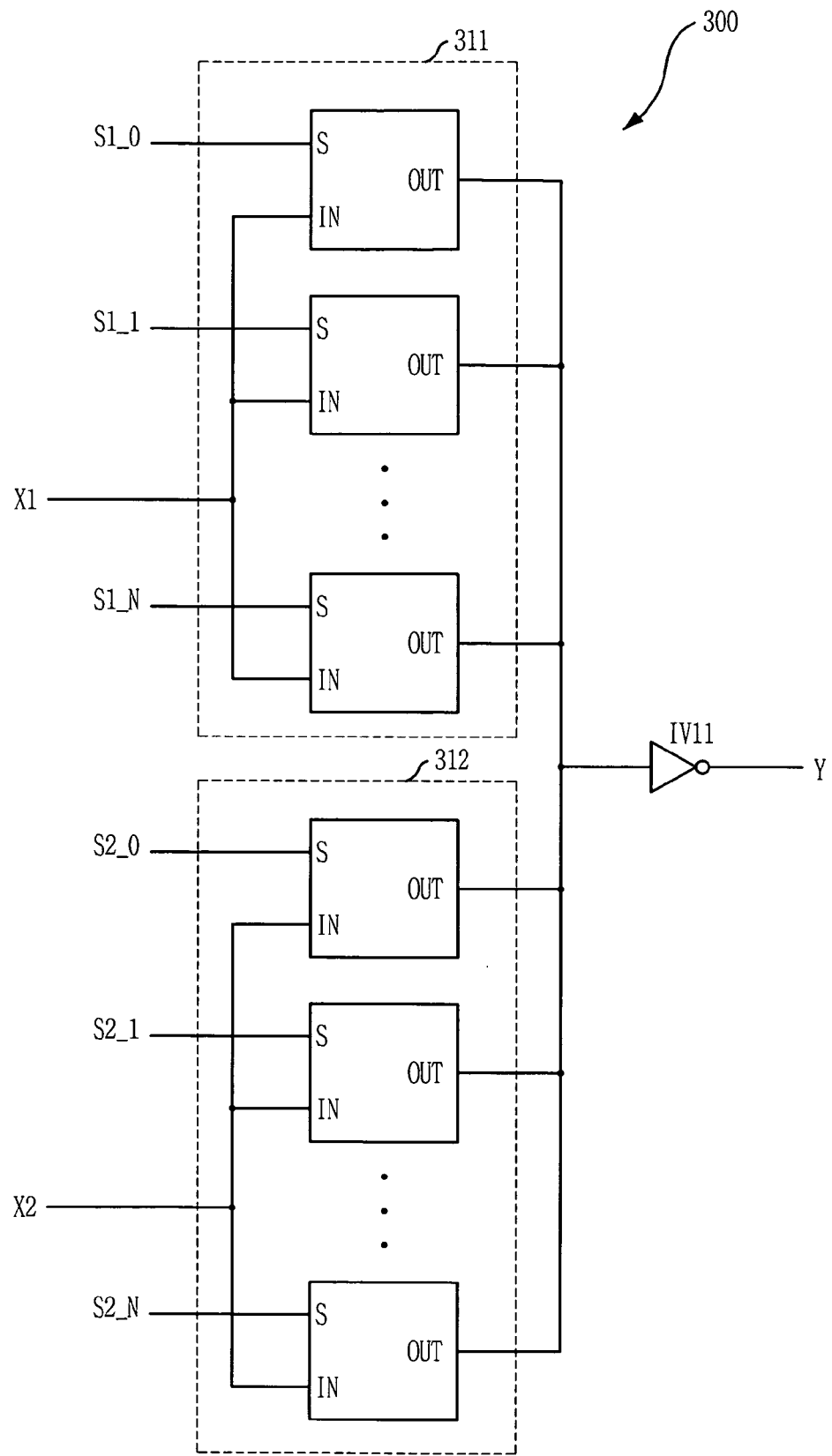
Figure 14C:
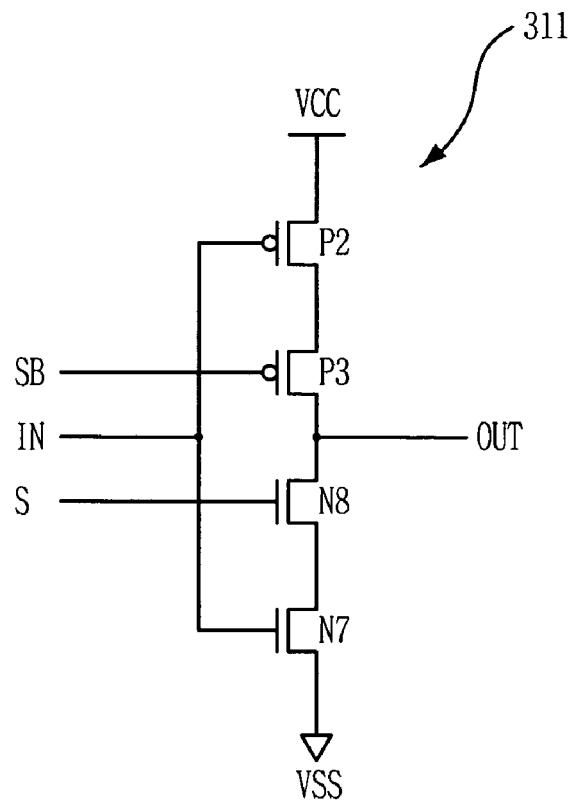

FIG. 14B is a detailed circuit diagram describing the first phase blender 300.

As shown, the first phase blender 300 includes a plurality of first mixing units 311, a plurality of second mixing units 312 and an eleventh inverter IV11.

Each of the plural first mixing units 311 receives one of plural first mix control signals S1_0 to S1_N via a first input node S and the first clock FIN_CLK1 outputted from the first fine delay line 240 via a second input node IN. Hence, in case that a signal inputted from the second input node IN is in a logic level 'LOW', each of the first mixing units 311 outputs a high impedance signal HIGH_Z via an output node OUT. In case that the signal inputted from the second input node IN is in a logic level 'HIGH', each of the first mixing units 311 outputs an inverted first clock via the output node OUT.

Each of the plural second mixing units 312 receives one of a plurality of second mix control signals S2_0 to S2_N via a first input node S and the second clock FIN_CLK2 outputted from the second fine delay 250 via a second input node IN. Hence, in case that a signal inputted from the second input node IN is in a logic level 'LOW', each of the second mixing units 312 outputs a high impedance signal HIGH_Z via an output node OUT. In case that the signal inputted from the second input node IN is in a logic level 'HIGH', each of the second mixing units 312 outputs an inverted second clock via the output node OUT.

FIG. 14B is a detailed circuit diagram describing one of the first mixing units 311.

As shown, the first mixing unit 311 includes a second PMOS transistor P2, a third PMOS transistor P3, an eighth NMOS transistor N8 and a seventh NMOS transistor N7, which are connected in series between the source voltage VCC and a ground voltage VSS.

The second PMOS transistor P2 and the seventh NMOS transistor N7 have gates connected to the second input node IN. The eighth NMOS transistor N8 has a gate connected to the first input node S. The third PMOS transistor P3 has a gate connected to an inverted first input node SB. Herein, drains of the third PMOS transistor P3 and the eighth NMOS transistor N8 are connected to the output node OUT in common.

Figure 14D:
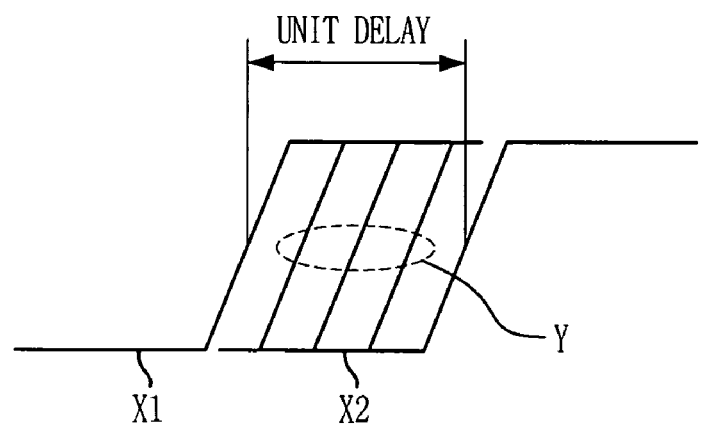

FIG. 14D is a waveform diagram illustrating an operation of the first phase blender 300.

As shown, the first phase blender 300 mixes the first clock FIN_CLK1 and the second clock FIN_CLK2 inputted via the input nodes X1 and X2 to output the mixed signal as the first DLL clock DLL_CLK1 via the output node Y. Herein, the DLL clock DLL_CLK1 has a phase between the first clock FIN_CLK1 and the second clock FIN_CLK2.

Figure 15A:
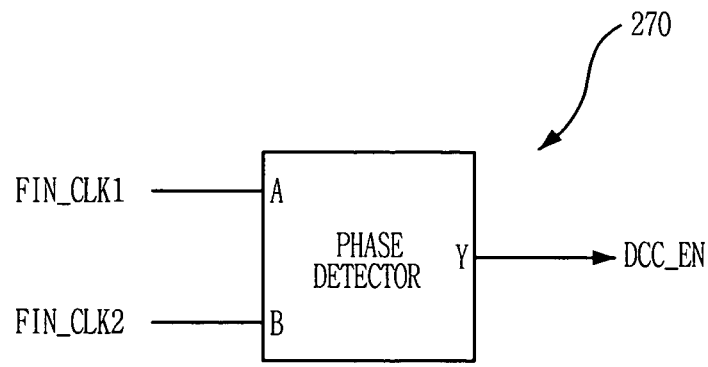
FIGS. 15A to 15C are a block diagram and a waveform diagram depicting a first phase detector as shown in FIG. 2.
Figure 15B:
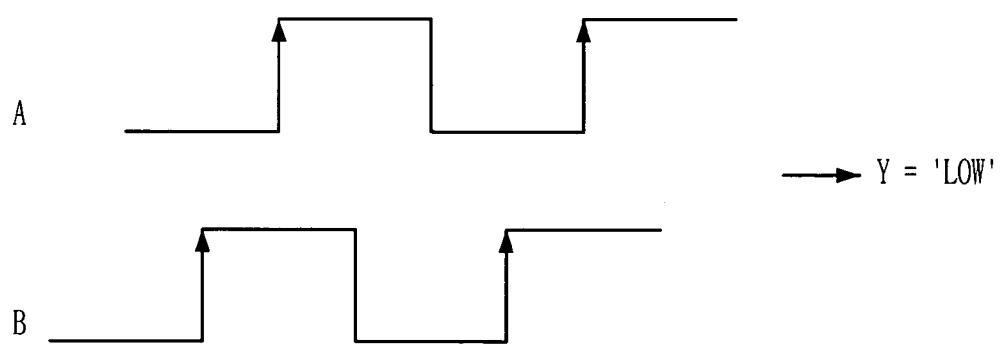
Figure 15C:
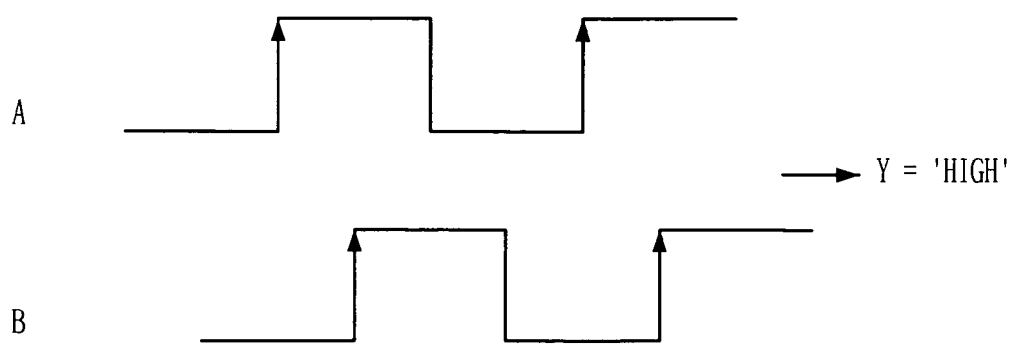

FIGS. 15A to 15C are a block diagram and a waveform diagram depicting the first phase detector 270 as shown in FIG. 2.

In detail, FIG. 15A is a symbol diagram showing the first phase detector 270.

As shown, the first phase detector 270 receives the first clock FIN_CLK1 via a first input node A and the second clock FIN_CLK2 via a second input node B, to output the correct enable signal DCC_EN.

The second phase detector 280 can be implemented with the same structure as that of the first phase detector 270.

FIGS. 15B and 15C are waveform diagrams illustrating an operation of the first phase detector 270.

Referring to FIG. 15B, in case that the second clock FIN_CLK2 is advanced to the first clock FIN_CLK1, the correct enable signal DCC_EN is outputted as a logic level 'LOW'. On the contrary, referring to FIG. 15C, in case that the first clock FIN_CLK1 is advanced to the second clock FIN_CLK2, the correct enable signal DCC_EN is outputted as a logic level 'HIGH'.

Hereinafter, the operation of the DDL in accordance with the present invention will be described in detail referring to the accompanying drawings.

The delay amount may be increased by passing a path including the pre-delay line 160, the first fine delay line 240, the first phase blender 300, the first delay model 210 and the first phase comparator & phase detector 140. At an initial operation, as shown in FIG. 5, after the multiplexer 120 operates, one of the rising clock RCLK and the falling clock FCLK inputted to the pre-delay line 160 is delayed by a (0.5×tCLK) at maximum. The pre-delay line 160 increases the delay amount to synchronize the rising edge of the external ECLK with the rising edge of the first internal delay clock ICLK1. The first phase comparator & lock detector 140 inputs the left shift signal SHIFT_L and the right shift signal SHIFT_R to the first shift register 150 and the second shift register 180.

Then, the delay amount may be increased by passing a path including the post-delay line 170, the second fine delay 250, the second phase blender 310, the second delay model 220 and the second phase comparator 180.

The pre-delay line 160 and the post-delay line 170 correct the delay amount until the rising edge of the external ECLK is synchronized with the rising edge of the first internal delay clock ICLK1. When the rising edge of the external ECLK is synchronized with the rising edge of the first internal delay clock ICLK1, the first lock detector 144 outputs the first lock signal LOCK_STATE to the delay line control unit 200. According to the lock signal LOCK_STATE, the operation of the pre-delay line 160 and the post-delay line 170 is stopped. After then, the first fine delay line 240 and the second fine delay 250 correct the delay amount based on the third shift register 230 and the fourth shift register 260.

After correctly finishing the operation of the first fine delay line 240 and the second fine delay 250, the first phase detector 270 activates the correct enable signal DCC_EN by comparing the first clock FIN_CLK1 with the second clock FIN_CLK2, and outputs the correct enable signal DCC_EN to the delay line control unit 200. According to the correct enable signal DCC_EN, the DCC operation is performed and the delay line control unit 200 selects an additional delay line. Then, after the DCC operation, a delay correct operation is performed using a mixed signal of the rising clock RCLK and the falling clock FCLK At this time, as shown in FIGS. 9A and 9B, the delay line control unit 200 selectively activates the enable signal EN to separately perform the delay correct operation of the first fine delay line 240 and the second fine delay 250.

Accordingly, according to the enable signal EN determined by comparing the rising clock RCLK with the falling clock FCLK, one of the first fine delay line 240 and the second fine delay 250 is selected to perform the DCC operation.

In other words, after the correct enable signal DCC_EN for the DCC operation is activated, the delay line control unit 200 receives correct information. In this time, the operations of the second phase comparator & lock detector 190 and the second delay model 220 are stopped. One of the first fine delay line 240 and the second fine delay 250 performs the DCC operation according to the first phase comparing signal PD_OUT outputted from the first phase comparator 142 and the second phase comparing signal outputted from the second phase comparator.

Accordingly, as shown in FIG. 9C, in case that the phase of the rising clock RCLK is advanced to the phase of the falling clock FCLK, a rising clock loop is selected to increase the delay amount. On the contrary, in case that the phase of the falling clock FCLK is advanced to the phase of the rising clock RCLK, a falling clock loop is selected to decrease the delay amount. In case that a difference between the phase of the rising clock RCLK and the falling clock FCLK is ambiguous, the rising clock loop is selected in preference to the falling clock loop.

As described above, in the present invention, the delay line control unit 200 is designed in consideration of a relationship between the rising clock RCLK and the falling clock FCLK. As a result, even if the rising edges of the rising clock RCLK and the falling clock FCLK skew because of an external power source, it is possible to maximize performances of the first phase blender 300 and the second phase blender 310 by performing the above DCC operation to match the rising edges of the rising clock RCLK and the falling clock FCLK.

In the present invention, the first clock buffer 110 and the second clock buffer 111 generate the rising clock RCLK having a duty error corresponding to the external clock ECLK, and the falling clock FCLK having an opposite duty cycle to the rising clock RCLK. At the same time, the rising edge of the falling clock FCLK is consistent with the rising edge of the external clock ECLK. Hence, the rising edges of the rising clock RCLK and the falling clock FCLK have the same phase with the external clock ECLK and the falling edges of the rising clock RCLK and the falling clock FCLK have a different phase according to the duty error of the external clock ECLK. To generate the first DLL clock DLL_CLK1 having an exact 50% duty cycle, the present invention takes a medium phase of the falling edge of the rising clock RCLK and the falling clock FCLK.

Namely, in the present invention, it is possible to reduce jitter by using a difference between the rising clock RCLK having a first phase and the falling clock FCLK having a second phase. Herein, the first phase is opposite to the second phase. At the same time, the difference maintains an amount corresponding to a difference between the first fine delay line 240 and the second fine delay 250. As a result, it is possible to maximize an efficiency of the DCC operation.

For example, in the present invention, if the delay amount of the jitter is a 40 ps, it is possible to reduce the delay amount of the jitter as a 20 ps by selectively controlling the first delay line and the second delay line.

As previously described, the DLL of the present invention performs the DCC operation regardless of the external power source noise. At the same time, the present invention provides the DLL for reducing the jitter, occurred in itself, by half.

The present application contains subject matter related to Korean patent application No. 2005-79597, filed in the Korean Intellectual Property Office on Aug. 29, 2006, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A delay locked loop (DLL) for reducing jitter, comprising:
   a multiplexing unit for receiving an external clock and an inverted external clock;
   a first delay line for generating a first internal clock by delaying an output clock of the multiplexing unit for a certain time, and generating a second internal clock by delaying the first internal clock for a determined time, in response to a first phase comparing signal and a second phase comparing signal;
   a delay line control unit for generating an enable signal;
   a second delay line for generating a first clock by delaying the first internal clock for a predetermined time, and generating a second clock by delaying the second internal clock for a preset time, under the control of the enable signal;
   a phase control unit for outputting a plurality of mix control signals and a first DLL clock and a second DLL clock by comparing a phase of the first clock with a phase of the second clock; and
   a phase comparing unit for generating the first phase comparing signal and the second phase comparing signal by comparing a phase of the first DLL clock and the second DLL clock with a phase of a rising clock.

2. The DLL as recited in claim 1, wherein the multiplexing unit generates the rising clock and a falling clock having an inverse phase of the rising clock, and selectively outputting one of the rising clock and the falling clock according to the first phase comparing signal.

3. The DLL as recited in claim 2, wherein the delay line control unit's activation is controlled by a phase difference between the first clock and the second clock during a duty cycle correction mode.

4. The DLL as recited in claim 3, wherein the phase control unit generates the first DLL clock and the second DLL clock by mixing the phases of the first clock and the second clock in response to the plurality of the mix control signals.

5. The DLL as recited in claim 4, wherein the phase comparing unit generates a lock signal for controlling an operation timing of the first delay line and the second delay line.

6. The DLL as recited in claim 1, wherein the first internal clock has an inverse phase of the second internal clock.

7. The DLL as recited in claim 2, wherein the first delay line generates the first internal clock and the second internal clock based on a medium phase of a falling edge of the rising clock and a falling edge of the falling clock.

8. The DLL as recited in claim 2, wherein the second delay line generates the first clock and the second clock based on the medium phase of a falling edge of the rising clock and a falling edge of the falling clock.

9. The DLL as recited in claim 2, wherein the multiplexing unit includes:
   a first buffer for generating the rising clock in synchronization with a rising edge of the external clock;
   a second buffer for generating the falling clock in synchronization with a falling edge of the external clock;
   a multiplexing controller for generating a select signal based on the first phase comparing signal; and
   a multiplexer for selecting one of the rising clock and the falling clock based on the select signal.

10. The DLL as recited in claim 9, wherein the first delay line includes:
    a first shift register for generating a first shift control signal for determining a first amount of time based on the first phase comparing signal;
    a pre-delay line for outputting the first internal clock by delaying the output clock of the multiplexing unit for the certain time based on the first shift control signal;
    a second shift register for generating a second shift control signal for determining a second amount of time based on the second comparing signal; and
    a post-delay line for outputting the second internal clock by delaying an inverse signal of the first internal clock for the determined time based on the first and the second shift control signals.

11. The DLL as recited in claim 10, wherein the first shift control signal is applied to the pre-delay line and the post-delay line at the same time.

12. The DLL as recited in claim 10, wherein each of the pre-delay line and the post-delay line contains a coarse delay line having a plurality of unit delay cells which are connected sequentially, to generate a coarse signal having a delay determined by the number of the unit cells.

13. The DLL as recited in claim 10, wherein the second delay line includes:
    a third shift register for generating a third shift control signal for determining a third amount of time based on the first phase comparing signal and the enable signal;
    a first fine delay unit for outputting the first clock by delaying the first internal clock for the predetermined time based on the third shift control signal;
    a fourth shift register for generating a fourth shift control signal for determining a fourth amount of time based on the second phase comparing signal and the enable signal; and
    a second fine delay unit for outputting the second clock by delaying the second internal clock for the preset time based on the fourth shift control signal.

14. The DLL as recited in claim 13, wherein the delay line control unit stops an operation of the second delay line in case that the lock signal is activated and selects one of the first fine delay unit and the second fine delay unit in case of entering the duty cycle correction mode.

15. The DLL as recited in claim 13, wherein each of the first fine delay unit and the second fine delay unit includes:
    a fine delay line having a plurality of unit delay cells, connected sequentially, for generating a first fine signal and a second fine signal whose delay is determined by the number of the unit cells; and
    a phase mixer for mixing phases of the first fine signal and the second fine signal to output the mixed signal to the phase control unit.

16. The DLL as recited in claim 15, wherein the fine delay line includes:
- a first fine delay line having the plurality of unit delay cells for delaying the first internal clock, by passing through N numbers of unit delay cells which are activated;
- a second fine delay line having the plurality of unit delay cells for delaying the second internal clock, by passing through (N+1) numbers of unit delay cells which are activated.

17. The DLL as recited in claim 2, wherein the delay line control unit selects a delay loop of the rising clock to increase a delay amount and a delay loop of the falling clock to decrease the delay amount, when the duty cycle correction mode enters.

18. The DLL as recited in claim 1, wherein the phase control unit includes:
- a first phase detector for comparing the phase of the first clock with the phase of the second clock to output the compared result to the delay line control unit;
- a second phase detector for receiving an inverted first clock and an inverted second clock to generate a phase detect signal;
- a phase mixer control unit for outputting the plurality of the mix control signals containing first mix control signals and second mix control signals based on the phase detect signal;
- a first phase blender for receiving the first clock and the second clock to generate the first DLL clock based on the first mix control signals; and
- a second phase blender for receiving the first clock and the second clock to generate the second DLL clock based on the second mix control signals.

19. The DLL as recited in claim 18, wherein each of the first and the second phase blenders contains:
- a plurality of first mixing cells for outputting one of a high impedance or the inverted first clock in response to the first mix control signals;
- a plurality of second mixing cells for outputting one of a high impedance or the inverted second clock in response to the second mix control signals; and
- an inverter for inverting an output of the first mixing cells and an output of the second mixing cells.

20. The DLL as recited in claim 19, wherein each of the first mixing cells includes:
- a first PMOS transistor having a source connected to a source voltage terminal and a gate receiving the first clock;
- a second PMOS transistor having a source connected to a drain of the first PMOS transistor and a gate receiving an inverted one of the first mix control signals;
- a first NMOS transistor having a drain connected to a drain of the second PMOS transistor and a gate receiving a corresponding one of the first mix control signals; and
- a second NMOS transistor having a drain connected to a source of the first NMOS transistor and a gate receiving the first clock, wherein the drains of the second PMOS transistor and the first NMOS transistor are connected to an input node of the inverter.

21. The DLL as recited in claim 19, wherein each of the second mixing cells has:
- a first PMOS transistor having a source connected to a source voltage terminal and a gate receiving the second clock;
- a second PMOS transistor having a source connected to a drain of the first PMOS transistor and a gate receiving an inverted one of the second mix control signals;
- a first NMOS transistor having a drain connected to a drain of the second PMOS transistor and a gate receiving a corresponding one of the second mix control signals; and
- a second NMOS transistor having a drain connected to a source of the first NMOS transistor and a gate receiving the second clock, wherein the drains of the second PMOS transistor and the first NMOS transistor are connected to an input node of the inverter.

22. The DLL as recited in claim 5, wherein the phase comparing unit includes:
- a first delay model for generating a first internal delay clock by delaying the first DLL clock and the external clock for a predetermined time;
- a first phase comparator for outputting the first phase comparing signal by comparing a phase of the first internal delay clock with the phase of the rising clock;
- a lock detector for outputting the lock signal for controlling the second delay line in case that the duty cycle correction mode enters;
- a second delay model for generating a second internal delay clock by compensating a difference between the second DLL clock and the external clock; and
- a second phase comparator for outputting the second phase comparing signal by comparing a phase of the second internal delay clock with the phase of the rising clock.

23. The DLL as recited in claim 22, wherein the first or the second phase comparator includes a flip-flop for receiving the first or second internal delay clock to output the first or the second phase comparing signal in synchronization with the rising clock.

24. The DLL as recited in claim 22, wherein the phase comparing unit activates the lock signal when rising edges of the first DLL clock and the second DLL clock are synchronized with the rising edge of the external clock.

* * * * *

UNITED STATES PATENT AND TRADEMARK OFFICE
CERTIFICATE OF CORRECTION

PATENT NO. : 7,282,974 B2  
APPLICATION NO. : 11/323912  
DATED : October 16, 2007  
INVENTOR(S) : Hyun-Woo Lee Page 1 of 1

It is certified that error appears in the above-identified patent and that said Letters Patent is hereby corrected as shown below:

In Column 16, Claim 22, line 30, please delete "and the external".

In Column 16, Claim 22, line 31, please delete "clock".

Signed and Sealed this

Thirtieth Day of June, 2009

JOHN DOLL  
*Acting Director of the United States Patent and Trademark Office*